United States Patent
Frederick, Jr. et al.

(10) Patent No.: US 9,450,571 B2
(45) Date of Patent: Sep. 20, 2016

(54) DATA AND CLOCK SIGNAL VOLTAGES WITHIN AN INTEGRATED CIRCUIT

(71) Applicant: ARM LIMITED, Cambridge (GB)

(72) Inventors: Marlin Wayne Frederick, Jr., Austin, TX (US); Ashwani Kumar Srivastava, Bangalore (IN)

(73) Assignee: ARM Limited, Cambridge (GB)

( * ) Notice: Subject to any disclaimer, the term of this patent is extended or adjusted under 35 U.S.C. 154(b) by 11 days.

(21) Appl. No.: 14/294,593

(22) Filed: Jun. 3, 2014

(65) Prior Publication Data
US 2015/0349760 A1    Dec. 3, 2015

(51) Int. Cl.
*H03K 5/02* (2006.01)

(52) U.S. Cl.
CPC ........................................ *H03K 5/02* (2013.01)

(58) Field of Classification Search
CPC ........................................................ H03K 5/02
USPC ................................. 327/201–203, 211–212
See application file for complete search history.

(56) References Cited

U.S. PATENT DOCUMENTS

| | | | |
|---|---|---|---|
| 7,353,138 B2 * | 4/2008 | Wang | ........................ G06F 1/04 702/177 |
| 2009/0251173 A1 * | 10/2009 | Zhang | ............ H03K 19/018521 326/81 |

* cited by examiner

*Primary Examiner* — Kenneth B Wells
(74) *Attorney, Agent, or Firm* — Pramudji Law Group PLLC; Ari Pramudji

(57) ABSTRACT

An integrated circuit 2 has data processing circuitry processing a data signal passing along a data path 14. Clocked circuitry coupled to the data processing circuitry serves to regulate passage of the data signal along the data path. The data signal is supplied at a data signal voltage amplitude and the clock signal is supplied at a different clock signal voltage amplitude. The clock signal voltage amplitude is higher than the data signal voltage amplitude. A separate clock signal power supply grid 12 is provided in addition to the data power supply grid 10.

19 Claims, 7 Drawing Sheets

DATA AND CLOCK SIGNAL VOLTAGES WITHIN AN INTEGRATED CIRCUIT

BACKGROUND OF THE INVENTION

1. Field of the Invention

This invention relates to the field of integrated circuits. More particularly, this invention relates to data and clock signal voltages within an integrated circuit.

2. Description of the Prior Art

It is known to provide integrated circuits which incorporate data processing circuitry configured to process data signals passing along a data path and using clock circuitry coupled to the data processing circuitry to regulate passage of the data signal along the data path under control of the clock signal. Such integrated circuits can take many different forms. Data values are typically passed along the data paths between data storage circuits which capture and store data values in synchronism with a clock signal. The clock signal provides timing control to the data processing circuitry and regulates the flow of data signals within the data processing circuitry.

In order to increase circuit density and reduce energy consumption there has been a drive towards forming integrated circuits using smaller process geometries to increase circuitry density and reduce energy consumption. However, as the geometries become smaller there is an increase in the level of variation in circuit performance that arises due to PVT variations (process, voltage, temperature). With a rise in the amount of variation in operating speed of the circuit elements which can arise it has become necessary to add increased levels of margin to the operational timing of the circuit so as to ensure that variations in the timing which occur as a consequence of PVT variations do not cause timing violations.

As an example, the input to a data signal capture and storage circuit (latch) may have a specified hold time which is a minimum time for which a data value to be captured and stored will be held at the input to that latch. If this hold time is too low, then it can produce a timing violation whereby a data signal from a following clock cycle is incorrectly captured in the preceding clock signal due to variations in the speed of operation of adjacent stages along the data path. One way of dealing with this problem is to provide hold buffers in the data path which serve to slow down data signal propagation in a manner that will ensure a sufficient hold time. However, the provision of such hold buffers increases the circuit area and energy overhead in a manner that reduces the benefits that can be achieved by moving to smaller process geometries and lower operating voltages.

SUMMARY OF THE INVENTION

Viewed from one aspect the present invention provides an integrated circuit comprising:
  data processing circuitry configured to process a data signal passing along a data path within said data processing circuitry;
  clocked circuitry coupled to said data processing circuitry and configured to regulate passage of said data signal along said data path under control of a clock signal;
  data power supply circuitry coupled to said data processing circuitry and configured to supply power to said data processing circuitry; and
  clock power supply circuitry coupled to said clocked circuitry and configured to supply power to said clocked circuitry;
wherein said data power supply circuitry and said clock power supply circuitry are configured such that, at least when said data processing circuitry is actively processing said data signal passing along said data path, said data signal has a data signal voltage amplitude and said clock signal has a clock signal voltage amplitude that is different from said data signal voltage amplitude.

The present technique recognises that the operating characteristics desired for data processing circuitry and clocked circuitry may differ in a manner in which it becomes desirable to operate with a clock signal voltage amplitude that is different from the data signal voltage amplitude. The normal design prejudice in the field is that the overhead associated with supplying a clock signal and a data signal with different voltage amplitudes would be strongly undesirable. Furthermore, as the energy consumed by the circuitry rapidly increases with the operating voltage, it would normally be considered desirable to operate both the data signals and the clock signals at the same voltage level which was as low as possible. The present technique moves against these design prejudices and recognises that the different roles of the data processing circuitry and the clocked circuitry are such that if they operate with signals having different voltage amplitudes, then an overall gain in performance may be achieved despite the need for additional power supply distribution infrastructure and that both the clock signal and the data signal will not be operating at the minimum possible voltage amplitude.

It will be appreciated that for each of the data signal and the clock signal the voltage amplitude corresponds to the difference in voltage level as they switch between their respective first level and second level. In many systems it will be desirable that the data signal and the clock signal share a ground voltage level as this will reduce the powered distribution infrastructure overhead.

While not necessarily the case, in some embodiments the clock signal voltage amplitude is greater than a data signal voltage amplitude. Operating the clock circuitry with a higher clock signal amplitude reduces the variation in the performance of the clocked circuitry in a manner which produces benefits that outweigh the disadvantages of having to provide a separate clock signal voltage and the extra energy consumed in operating the clocked circuitry at the higher voltage. The data processing circuitry can still operate at a lower voltage and tolerate a higher degree of variation in its operation compared with the clocked circuitry. The clocked circuitry is concerned with regulating and controlling the timing of the operation of the processing circuitry and accordingly is less tolerant to variation in its operating performance.

The data power supply circuitry and the clock power supply circuitry may be separate, e.g. separate data power grid and clock power grid extending through the integrated circuit. Certain portions of the data power supply circuitry and the clock power supply circuitry may be shared, but at at least some level as the data processing circuitry and the clocked circuitry are approached the data power supply circuitry and the clock power supply circuitry split and become separate as they are handling respectively a data signal and a clock signal with different voltage amplitudes.

In some embodiments the data power supply circuitry and the clock power supply circuitry may be configured to operate in a plurality of modes having different respective associated voltage amplitudes. In this context, a difference between the data signal voltage amplitude and the clock signal voltage amplitude may vary as the data signal voltage amplitude varies. Thus, the difference between the two voltage amplitudes may be a function of the voltage amplitudes themselves.

In some embodiments the difference increases monotonically as the data signal voltage amplitude increases, in some embodiments the difference decreases monotonically as the data signal voltage amplitude increases, whereas in further embodiments the difference may vary non-monotonically as the data signal voltage amplitude increases. The variation in the difference between the data signal voltage amplitude and the clock signal voltage amplitude as a function of the amplitude itself may be selected and matched to the particular characteristics of the integrated circuit being used and the way in which the variation in its operating performance changes in dependence upon signal voltage amplitude.

The data path may extend between a plurality of data signal value capture and storage circuits which are controlled by the clock signal to operate synchronously with each other. Such an arrangement provides a robust and manageable way of designing and providing an integrated circuit to perform complex high performance data processing.

The data signal value and capture storage circuits may comprise a plurality of transistors having respective gate inputs. The clock signal may be supplied to these gate inputs so as to switch these transistors between conductive and non-conductive states. Supplying the clock signal to gate inputs provides a way of enabling the different voltage levels associated with the data signal and the clock signal to co-exist without the overhead associated with dedicated level shifter circuitry.

The data inputs which form part of the data signal value capture and storage circuits may themselves be part of one or more of a transmission gate, a tristate multiplexer, a clock gated inverter and an inverter. Such circuit elements may be used to form a data signal value capture and storage circuit that has a low area and energy overhead and is able to operate with data signals and clock signals having different voltage amplitudes.

In some embodiments the plurality of data signal capture and storage circuits may comprise a plurality of master slave latch circuits. Master slave latch circuits are well suited to the use of the present techniques.

The data processing circuitry within the integrated circuit may include one or more combinatorial logic circuits disposed within the data path between the plurality of data signal capture and storage circuits and configured to control a value of the data signal and in dependence upon one or more further data signals. Such combinatorial logic circuits may operate with the data signal voltage amplitude to consume less power and yet be coordinated and controlled by the clocked circuitry which operates with the clock signal having a higher voltage amplitude so is less prone to undesirable variation.

As previously mentioned, the clock signal voltage amplitude differing from the signal voltage amplitude serves to produce a different degree in variation in operation of the data processing circuitry in the clocked circuitry and dependence upon one or more of manufacturing process variation, operating voltage level variation and operating temperature variation. The degree of variation may be less in the clock circuitry than in the data processing circuitry.

Viewed from another aspect the present invention provides an integrated circuit comprising:

data processing means for processing a data signal passing along a data path within said data processing means;

clocked means coupled to said data processing means for regulating passage of said data signal along said data path under control of a clock signal;

data power supply means coupled to said data processing means for supplying power to said data processing means; and clock power supply means coupled to said clocked means for supplying power to said clocked means;

wherein said data power supply means and said clock power supply means operate such that, at least when said data processing means is actively processing said data signal passing along said data path, said data signal has a data signal voltage amplitude and said clock signal has a clock signal voltage amplitude that is different from said data signal voltage amplitude.

Viewed from a further aspect the present invention provides a method of operating an integrated circuit comprising the steps of:

processing a data signal passing along a data path within data processing circuitry;

regulating passage of said data signal along said data path using clocked circuitry operating under control of a clock signal;

supplying power to said data processing circuitry; and supplying power to said clocked circuitry;

wherein said steps of supplying power to said data processing circuitry and supplying power to said clocked circuitry are such that, at least when actively processing said data signal passing along said data path, said data signal has a data signal voltage amplitude and said clock signal has a clock signal voltage amplitude that is different from said data signal voltage amplitude.

The above, and other objects, features and advantages of this invention will be apparent from the following detailed description of illustrative embodiments which is to be read in connection with the accompanying drawings.

BRIEF DESCRIPTION OF THE DRAWINGS

Embodiments of the invention will now be described, by way of example only, with reference to the accompanying drawings in which.

DESCRIPTION OF THE EMBODIMENTS

Figure 1:
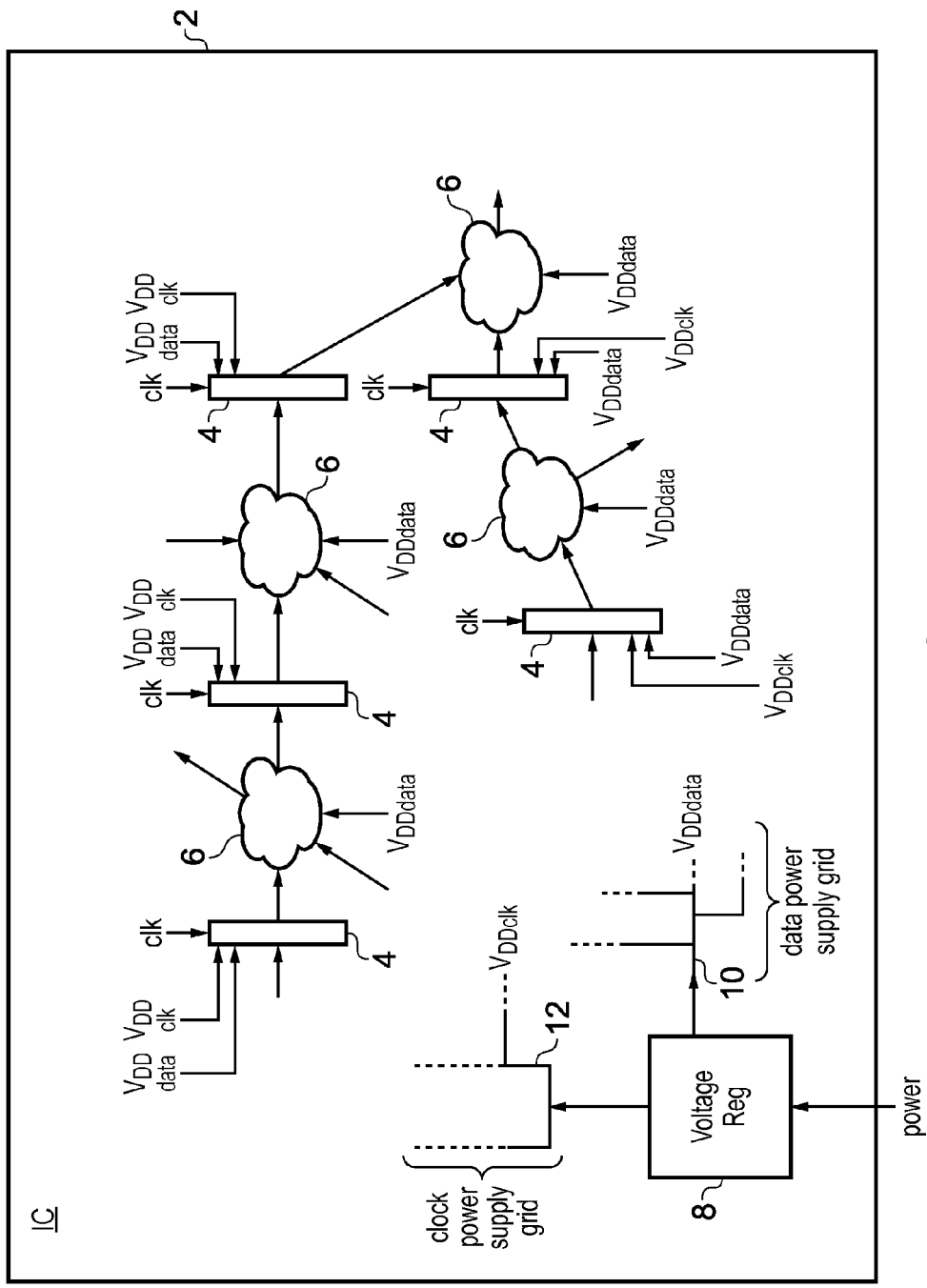
FIG. 1 schematically illustrates an integrated circuit operating with a data signal voltage amplitude that is different to a clock signal voltage amplitude.

FIG. 1 schematically illustrates an integrated circuit 2 including a plurality of data signal capture and storage circuits 4 between which data signals propagate through combinatorial logic circuits 6. The combinatorial logic circuits 6 pass data signals along data paths when the combinatorial logic circuits 6 are actively processing data within that combinatorial logic 6 and combine signals from elsewhere as illustrated in order to provide a data signal which is passed to the next data signal capture and storage circuit 4.

The combinatorial logic circuits 6 operate with data signals having a data signal voltage amplitude based upon the data signal power supply voltage VDDdata. The data signal capture and storage circuits 4 are supplied with both the data signal supply voltage VDDdata and the clock supply voltage VDDclk. A portion of the circuitry within the data signal capture and storage circuit 4 is clocked circuitry and a portion is data processing circuitry. The clocked circuitry is coupled to the data processing circuitry and serves to regulate the passage of data signals along the data paths through the combinatorial logic 6 between the different data signal capture and storage circuits 4. The clocked circuitry is responsive to a clock signal clk which has an amplitude corresponding to the supply voltage VDDclk.

The integrated circuit 2 includes both data power supply circuitry 8, 10 and clock power supply circuitry 8, 12. External power is supplied to a voltage regulator 8 which generates a data signal power supply voltage at the level VDDdata which is distributed around the integrated circuit 2 via a data power supply grid 10. In a similar way, the voltage regulator 8 also generates a clock power supply voltage VDDclk which is distributed around the integrated circuit 2 via a clock power supply grid 12. The data power supply grid 10 and the clock power supply grid 12 are separate as they pass separate voltages which have different levels. The power supply for the data signal is between the data signal supply voltage VDDdata level and ground level whereas the clocked circuitry power supply is between the clock signal voltage VDDclk level and the ground level (shared with the data signal).

Figure 2:
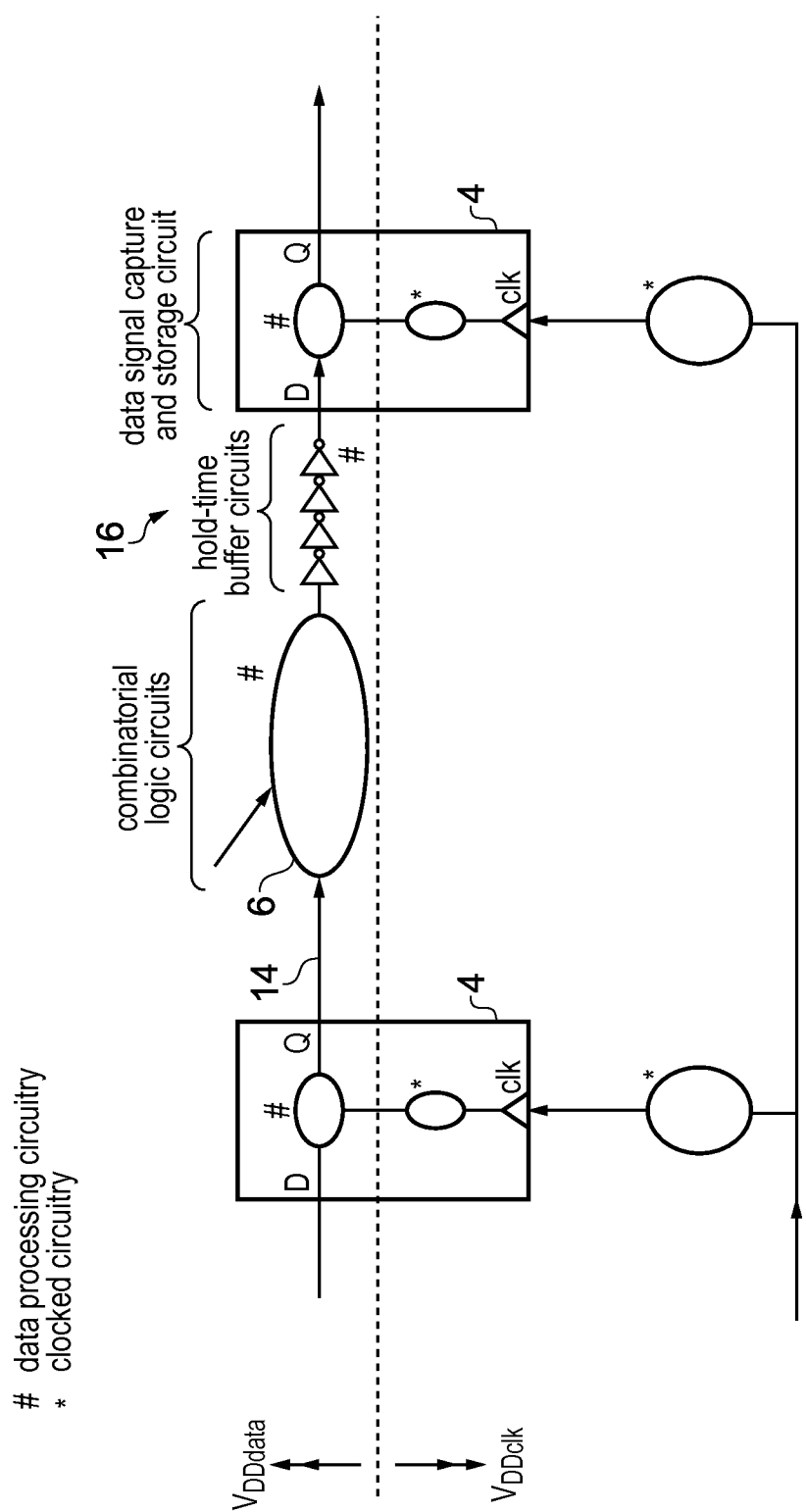
FIG. 2 schematically illustrates data signal capture and storage circuits including data processing circuitry and clocked circuitry.

FIG. 2 schematically illustrates a pair of adjacent data signal capture and storage circuits 4 having a data path 14 extending therebetween through combinatorial logic circuits 6 and hold time buffer circuits 16. The data signal capture and storage circuits 4 may be in the form of master slave latches with a portion of each of the data signal capture and storage circuits 4 comprising clocking circuitry and a portion comprising data processing circuitry.

The data processing circuitry is supplied with power at the data signal voltage level VDDdata and the data signal varies between the data signal voltage level VDDdata and ground. A different portion of the data capture and storage circuits 4 is formed of clocked circuitry which is supplied with power at the clock signal voltage level VDDclk. The combinatorial logic circuit 6 and the hold-time buffer circuits 16 which form part of the data path 14 operate using data signals of supply voltage VDDdata.

Figure 3:
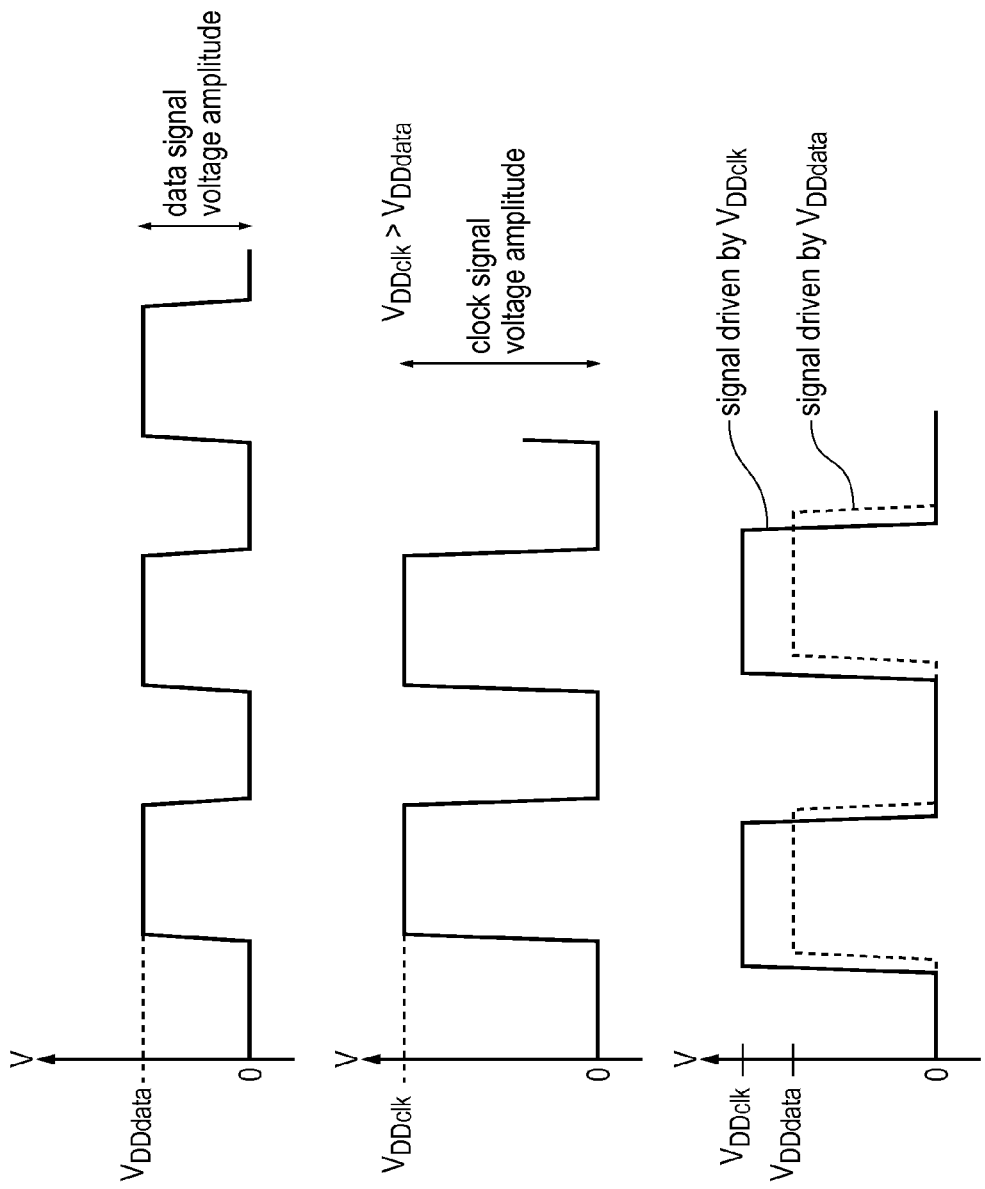
FIG. 3 schematically illustrates waveforms of a data signal and a clock signal.

FIG. 3 schematically illustrates example waveforms for a data signal propagating along a data path 14 and a clock signal being used to regulate passage of the data signal along that data path 14. As shown in FIG. 3, the data signal voltage amplitude is less than the clock signal voltage amplitude. The voltage amplitude is the difference between the lower level (ground) and the upper level of each of the signals. The data signal and the clock signal both extend from a common ground voltage level (zero volts) up to respective levels of VDDdata and VDDclk. FIG. 3 also shows an overlay of the two signals driven respectively by VDDdata and VDDclk showing the difference in amplitude.

Figure 4:
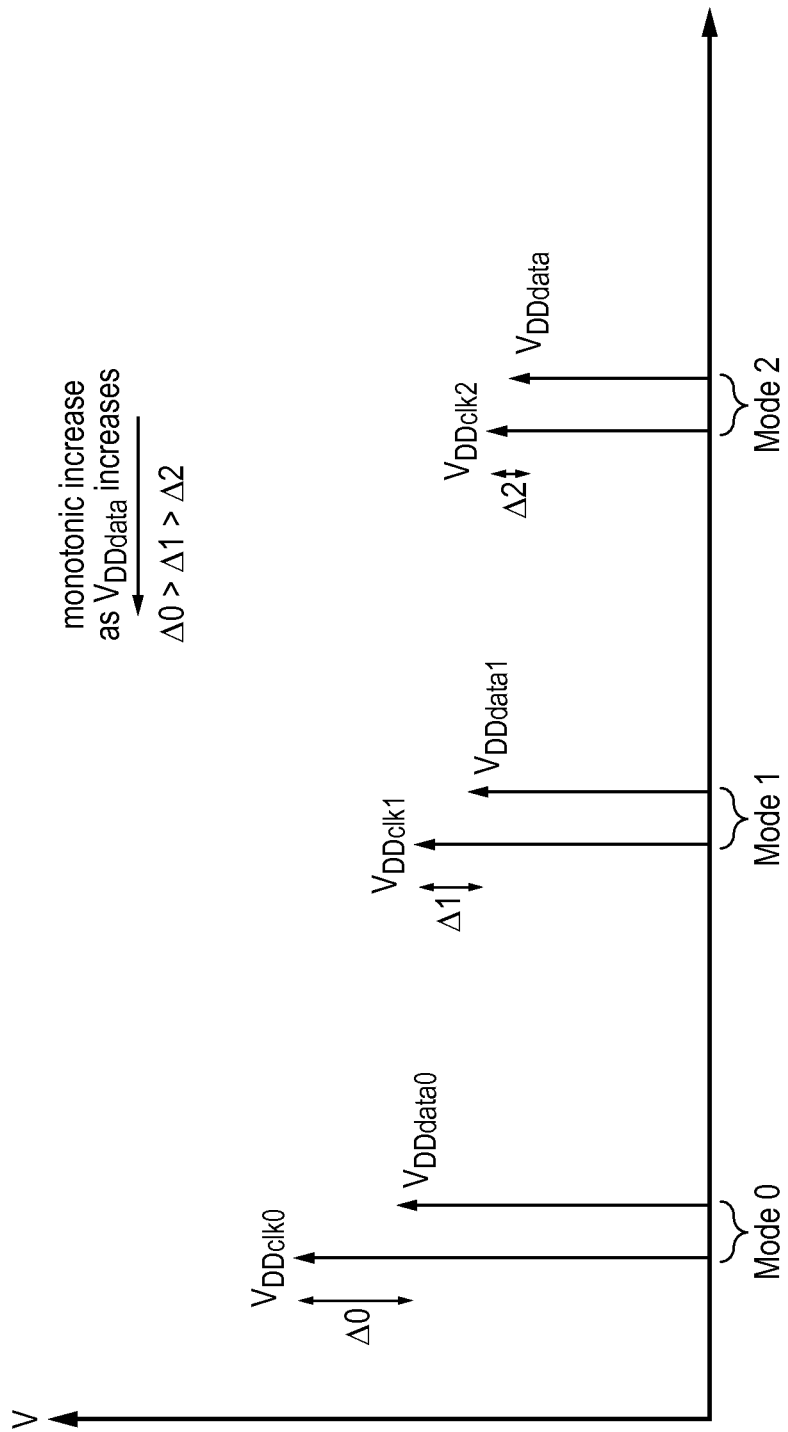
FIG. 4 schematically illustrates different modes of operation having associated different clock voltages and data voltages.

FIG. 4 schematically illustrates how different data signal voltage amplitudes and clock signal voltage amplitudes may be used in different operating modes of the integrated circuit 2. Such different modes of operation may correspond to different modes within a dynamic voltage scaling (DVS) scheme used to reduce power/energy consumption within an integrated circuit. As illustrated in FIG. 4, the clock signal voltage amplitude is greater than the data signal voltage amplitude. The difference between these two voltage amplitude also differs between the different modes. As the data signal voltage amplitude increases, the difference between the data signal voltage amplitude and the clock signal voltage amplitude monotonically increases in the example of FIG. 4. In other embodiments this variation could be a monotonic decrease or a non-monotonic variation depending upon the characteristics of the system concerned.

Figure 5:
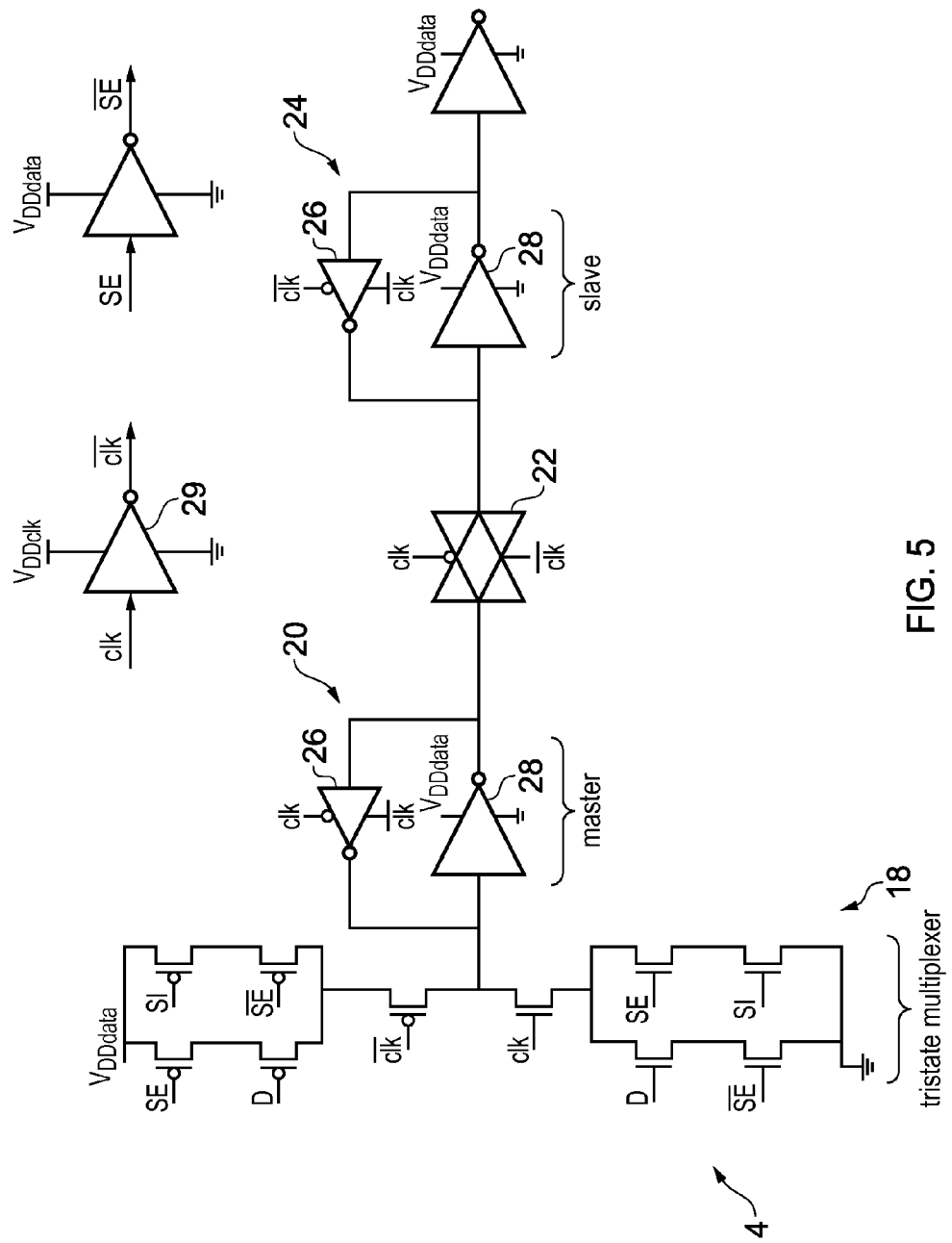
FIG. 5 schematically illustrates a data signal capture and storage circuit operating with different data signal and clock signal voltages.

FIG. 5 schematically illustrates an example of a data capture and storage circuit 4 which includes both data processing circuitry for passing a data signal along a data path and a clocked circuitry for regulating the passage of the data signal longer data path under control of the clock signal. In particular, the data signal capture and storage circuitry 4 of FIG. 5 comprises a master slave latch with a tristate multiplexer 18 at the input to the master stage 20. A transmission gate 22 controls passage of the data signal from a master stage 20 to a slave stage 24. Within the master stage 20 and the slave stage 24 there are disposed clock gated inverters 26 which provide feedback to hold a captured data signal value at that stage as controlled by the clock signal clk. An inverter 29 serves to invert the clock signal clk to form an inverted clock signal $\overline{clk}$.

The tristate multiplexer 18 serves to select between a data path input D during normal functional mode operation and a scan input value SI during diagnostic operation under control of a scan enable signal SE. Furthermore, the clock signal clk serves to gate either the functional mode D signal or the diagnostic signal SI signal from reaching the input to the master stage 20 under control of the clock signal clk. The clock signal clk is supplied to the gate input of the transistors controlling access to the input of the master stage 20. The stack of transistors forming the tristate multiplexer 18 is supplied with power at the data signal voltage level VDDdata, but the gate voltages applied to the transistors at the input to the master stage 20 are at the clock signal voltage VDDclk, which is higher than the data signal voltage VDDdata. This difference does not in practice cause a difficulty as the higher voltage is applied to the gate input and accordingly these gate input are overdriven in a manner in which the transistor concerned is either fully on or fully off, but does not cause inappropriate behaviour or a voltage clash.

Within the master stage 20 and the slave stage 24, an inverter 28 lies on the data path and is driven at the data signal voltage level VDDdata. A clock gated inverter 26 within each of these stages 20, 24 serves to provide feedback under control of the clock signal, i.e. is powered on or powered off dependent upon the clock signal value.

A transmission gate 22 serves to control/regulate the passage of the data signal from the master stage 20 to the slave stage 24. This transmission gate 22 is switched between conductive and non-conductive states in dependence upon the clock signal clk.

As illustrated in FIG. 5, the clock signal is derived from the clock signal power supply voltage VDDclk in both true and inverted forms. The scan enable signal SE is derived from the data signal supply voltage VDDdata in true and inverted forms for supply to the tristate multiplexer 18.

The form of the circuitry of FIG. 5 is such that the clock signal is only supplied to the gate input of transistors which are operating using the data signal supply voltage level VDDdata so as to avoid voltage mismatch difficulties.

As illustrated in FIG. 1, an integrated circuit will typically include many instances of data signal capture and storage circuitry 4 as shown in FIG. 5. The combinatorial logic circuit 6 disposed in the data path between such data signal capture and storage circuits 4 controls the value of the data signal being propagated in dependence upon combinations of data signals gathered from different points within the integrated circuit 2 as will be familiar to those in this technical field. Hold time buffer circuits 16 may be provided in advance of the input to data signal capture and storage circuits 4 so as to ensure a minimum hold time sufficient to avoid timing malfunctions. As the clock signal operates at a higher voltage level together with the clocked circuitry, the clock signal and the clocked circuitry have less variation in their performance and accordingly hold time margins may be reduced in a manner which reduces the need for hold time buffer circuits 16. Hold time buffer circuits 16 may still be present, but may be reduced in number and so have their associated overhead reduced. This reduction in the need for hold time buffer circuitry 16 can more than compensate for the increased overhead of requiring a separate clock signal power distribution grid 12 as well as the energy cost associated with toggling the clock signal between signal levels with a greater voltage difference therebetween.

Figure 6:
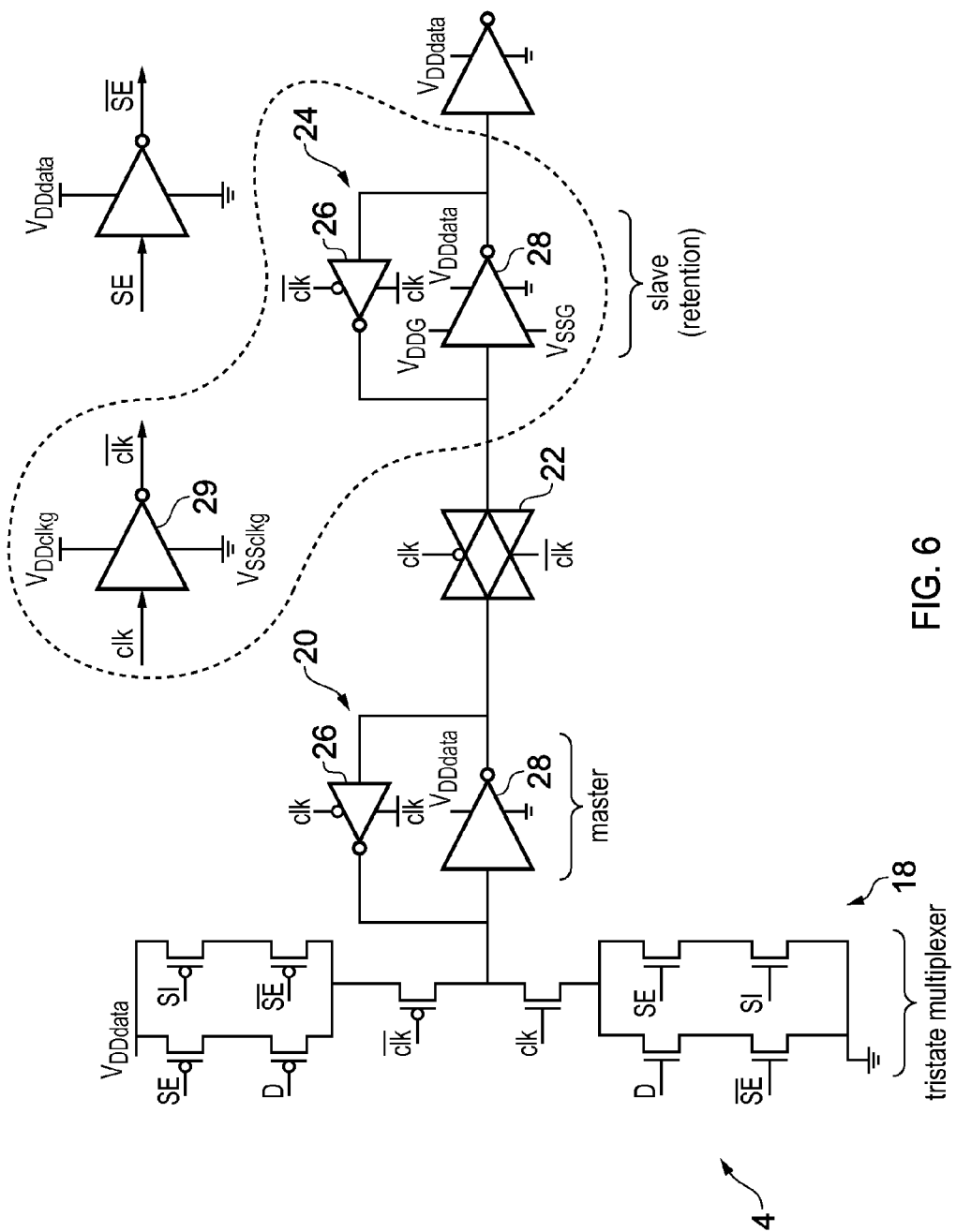
FIG. 6 schematically illustrates another example embodiment of a data signal capture and storage circuit operating with different data and clock signals during active processing and also supporting a retention mode.

FIG. 6 schematically illustrates a data signal and capture storage circuit 4 in accordance with another example embodiment. In this example embodiment, a data retention capability is provided. The circuit is similar to that of FIG. 5 with the addition of two further VDD power supplies, namely VDDG and VDDclkG. Two additional VSS supplies are also provided, namely VSSG and VSSclkG. During a retention mode of operation, the VDDdata power supply is powered down, but the VDDclkG and the VDDG power supplies remain powered up. This has the effect of maintaining the data currently held within the slave portion of the latch as the inverter 28 and the gated inverter 26 remain powered up. In practice, the portion of the circuitry surrounded by the dashed line in FIG. 6 remains powered while the remaining circuitry is powered down as a consequence of the change to VDDdata. At an overall level, the circuitry of FIG. 6 operates during its normal active mode to actively process a data signal passing along the data path using the VDDdata signal and the clock signal clk with their different supply voltage levels as previously discussed. When the circuitry of FIG. 6 switches out of this active mode into the retention mode, then data is retained within the slave latch.

It will be appreciated that in many real embodiments, not all of the data capture and storage circuits provided within an integrated circuit need have the retention capability. Rather, these retention capable circuits need only be provided at selection of positions within the integrated circuit to retain signal values which needed to be retained whereas other signal values could be lost without presenting any difficulty in restarting the processing operations. In the retention mode, data signal values are retained but they are not processed and are not passed along the data paths within the integrated circuit, rather they are statically held within portions of the circuitry such as the slave portion of the circuitry illustrated in FIG. 6.

Figure 7:
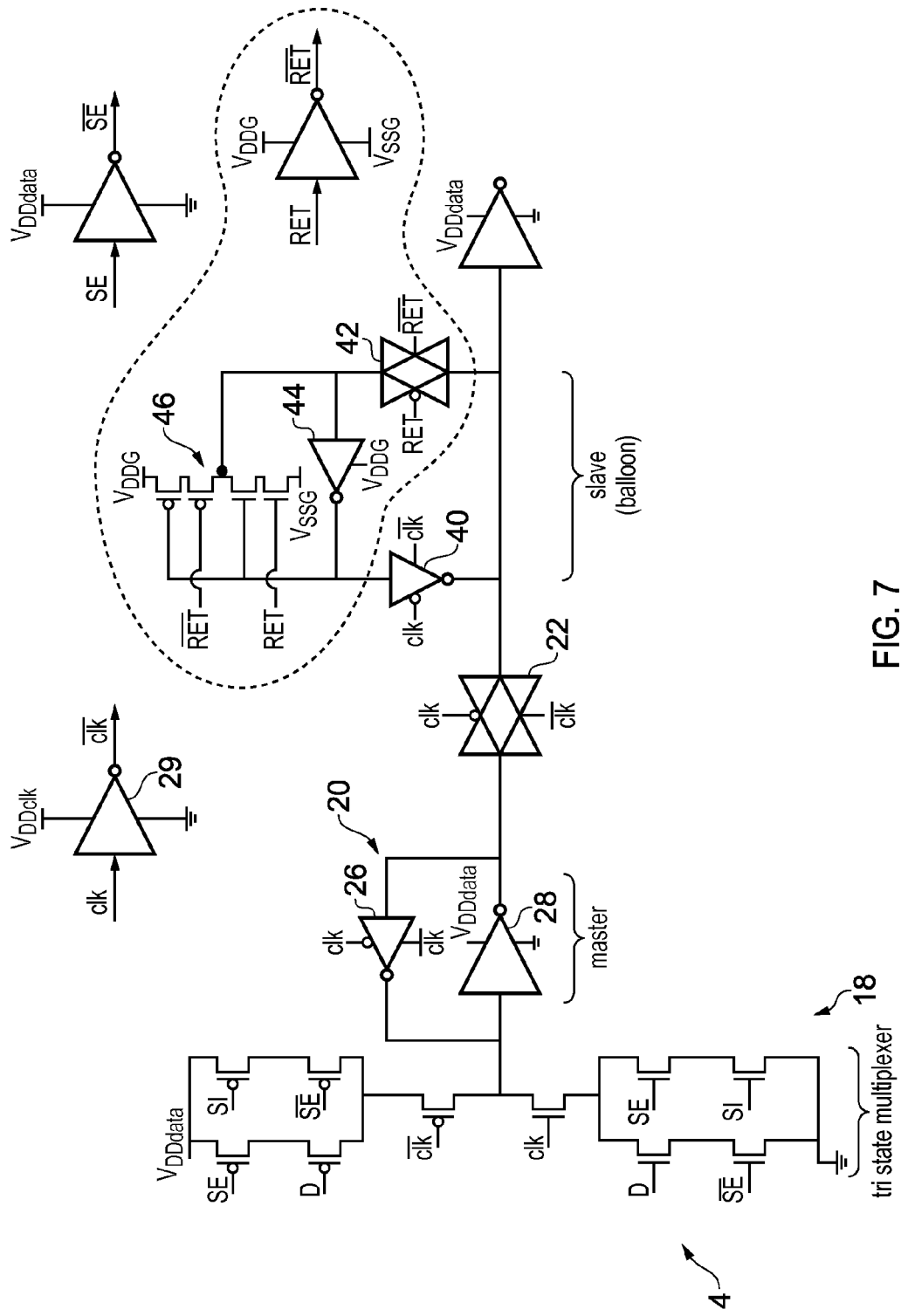
FIG. 7 schematically illustrates a further example embodiment supporting balloon latch operation.

FIG. 7 illustrates a further example embodiment of data signal capture and storage circuitry 4. Again, this is based upon the circuit of FIG. 5, but with a modification to the slave portion such that this now incorporates a balloon circuit. The slave portion includes a gated inverter 40, a transmission gate 42, an inverter 44 and a transistor stack 46, which also functions as a gated inverter. The portions of the circuitry within the dashed line of FIG. 7 are powered by a power supply signal VDDG which remains powered up during the retention mode. The other power supply signals, such as VDDdata and VDDclk, are powered down during retention mode. In the retention mode, the transmission gate 42 is closed and the inverter 44 and the transistor stack 46 act as a feedback loop to maintain the data signal value. When not in the retention mode, then the transmission gate 42 is open, the transistor stack 46 is disabled by the action of the retention signal RET and feedback takes place between the gated inverter 40 and the inverter 44 in order to hold a data signal value within the slave portion during the active processing.

As mentioned in relation to FIG. 6, the circuitry of FIG. 7 can operate when actively processing gated signal values passing along the data path to use a different data signal voltage amplitude and a different clock signal voltage amplitude as previously discussed. When in the retention mode, data signals are not passed along the data path but are held in the balloon latch portion of the circuitry and there is no active processing taking place within at least the portion of the circuitry held in the retention mode.

It will be appreciated that in some integrated circuits, multiple voltage domains may be provided and it is possible that within some domains the circuitry may be held within the retention mode with no active processing taking place and the data signals not propagating along the data paths, whereas in other of the domains at the same time, the circuitry may not be in the retention mode and may instead be actively processing data using the different data signal and clock signal voltages as previously discussed.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit comprising:
    data processing circuitry configured to process a data signal passing along a data path within said data processing circuitry;
    clocked circuitry coupled to said data processing circuitry and configured to regulate passage of said data signal along said data path under control of a clock signal;
    data power supply circuitry coupled to said data processing circuitry and configured to supply power to said data processing circuitry; and
    clock power supply circuitry coupled to said clocked circuitry and configured to supply power to said clocked circuitry;
    wherein said data power supply circuitry and said clock power supply circuitry are configured such that, at least when said data processing circuitry is actively processing said data signal passing along said data path, said data signal has a data signal voltage amplitude and said clock signal has a clock signal voltage amplitude that is different from said data signal voltage amplitude,
    wherein said data power supply circuitry is configured to operate in a plurality of modes having different associated data signal voltage amplitudes, and wherein said clock power supply circuitry is configured to operate in a plurality of modes having different associated clock signal voltage amplitudes.

2. An integrated circuit as claimed in claim 1, wherein said data signal has a voltage varying between a ground voltage level and a data supply voltage level and said clock signal has a voltage varying between said ground voltage level and a clock supply voltage level.

3. An integrated circuit as claimed in claim 1, wherein said clock signal voltage amplitude is greater than said data signal voltage amplitude.

4. An integrated circuit as claimed in claim 2, wherein a difference between said data supply voltage level and said ground voltage level is less than a difference between said clock supply voltage level and said ground voltage level.

5. An integrated circuit as claimed in claim 1, wherein said data power supply circuitry is separate from said clock power supply circuitry.

6. An integrated circuit as claimed in claim 5, wherein said data power supply circuitry comprises a data power grid extending through said integrated circuit; and
said clock power supply circuitry comprises a clock power grid separate from said data power grid and extending through said integrated circuit.

7. An integrated circuit as claimed in claim 1, wherein a difference between said data signal voltage amplitude and said clock signal voltage amplitude varies as said data signal voltage amplitude varies.

8. An integrated circuit as claimed in claim 7, wherein said difference one of:
(i) increases monotonically as said data signal voltage amplitude increases;
(ii) decreases monotonically as said data signal voltage amplitude increases; and
(ii) varies non-monotonically as said data signal voltage amplitude increases.

9. An integrated circuit as claimed in claim 1, wherein said data path extends between a plurality of data signal value capture and storage circuits, and said plurality of data value capture and storage circuits are controlled by said clock signal and operate synchronously with each other.

10. An integrated circuit as claimed in claim 9, wherein said plurality of data signal value capture and storage circuits each comprise a plurality of transistors having respective gate inputs and said clock signal is supplied to said gate inputs.

11. An integrated circuit as claimed in claim 10, wherein said gate inputs are part of one or more of:
(i) a transmission gate;
(ii) a tristate multiplexer;
(iii) a clock gated inverter; and
(iv) an inverter.

12. An integrated circuit as claimed in claim 10, wherein within said plurality of data signal value capture and storage circuits said clock signal is supplied only to said gate inputs.

13. An integrated circuit as claimed in any one of claim 9, wherein said plurality of data signal capture and storage circuits comprise a plurality of master slave latch circuits.

14. An integrated circuit as claimed in claim 1, wherein said clock signal voltage amplitude differing from said data signal voltage amplitude serves to produce a different degree of variation in operation of said data processing circuitry and said clocked circuitry in dependence upon one or more of:
(i) manufacturing process variation;
(ii) operating voltage level variation; and
(iii) operating temperature variation.

15. An integrated circuit as claimed in claim 14, wherein said degree of variation is less in said clocked circuitry than said data processing circuitry.

16. An integrated circuit comprising:
data processing circuitry configured to process a data signal passing along a data path within said data processing circuitry;
clocked circuitry coupled to said data processing circuitry and configured to regulate passage of said data signal along said data path under control of a clock signal;
data power supply circuitry coupled to said data processing circuitry and configured to supply power to said data processing circuitry;
clock power supply circuitry coupled to said clocked circuitry and configured to supply power to said clocked circuitry; and
one or more combinatorial logic circuits disposed within said data path between a plurality of data signal capture and storage circuits and configured to control a value of said data signal in dependence upon one or more further data signals,
wherein said data power supply circuitry and said clock power supply circuitry are configured such that, at least when said data processing circuitry is actively processing said data signal passing along said data path, said data signal has a data signal voltage amplitude and said clock signal has a clock signal voltage amplitude that is different from said data signal voltage amplitude, and
wherein said data path extends between said plurality of data signal value capture and storage circuits, and said plurality of data value capture and storage circuits are controlled by said clock signal and operate synchronously with each other.

17. An integrated circuit as claimed in claim 16, further comprising one or more hold-time buffer circuits disposed in said data path and configured to increase a propagation time of said data signal along said data path without said value of said data signal having a dependence upon any further data signals.

18. An integrated circuit comprising:
data processing means for processing a data signal passing along a data path within said data processing means;
clocked means coupled to said data processing means for regulating passage of said data signal along said data path under control of a clock signal;
data power supply means coupled to said data processing means for supplying power to said data processing means; and
clock power supply means coupled to said clocked means for supplying power to said clocked means;
wherein said data power supply means and said clock power supply means operate such that, at least when said data processing means is actively processing said data signal passing along said data path, said data signal has a data signal voltage amplitude and said clock signal has a clock signal voltage amplitude that is different from said data signal voltage amplitude,
wherein said data power supply means is configured to operate in a plurality of modes having different associated data signal voltage amplitudes, and
wherein said clock power supply means is configured to operate in a plurality of modes having different associated clock signal voltage amplitudes.

19. A method of operating an integrated circuit, the method comprising:

processing a data signal passing along a data path within data processing circuitry;

regulating passage of said data signal along said data path using clocked circuitry operating under control of a clock signal;

supplying power to said data processing circuitry with data power supply circuitry; and supplying power to said clocked circuitry with clock power supply circuitry, wherein said steps of supplying power to said data processing circuitry and supplying power to said clocked circuitry are such that, at least when actively processing said data signal passing along said data path, said data signal has a data signal voltage amplitude and said clock signal has a clock signal voltage amplitude that is different from said data signal voltage amplitude, wherein said data power supply circuitry is configured to operate in a plurality of modes having different associated data signal voltage amplitudes, and wherein said clock power supply circuitry is configured to operate in a plurality of modes having different associated clock signal voltage amplitudes.

* * * * *